(12) United States Patent
Lee et al.

(10) Patent No.: US 9,385,344 B2
(45) Date of Patent: Jul. 5, 2016

(54) ORGANIC LIGHT EMITTING DIODE DEVICE AND METHOD OF MANUFACTURING THE SAME

(71) Applicant: LG Display Co., Ltd., Seoul (KR)

(72) Inventors: Jae-Hyuk Lee, Paju-si (KR); Jun-Ho Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 1 day.

(21) Appl. No.: 14/087,447

(22) Filed: Nov. 22, 2013

(65) Prior Publication Data

US 2014/0175403 A1   Jun. 26, 2014

(30) Foreign Application Priority Data

Dec. 21, 2012   (KR) .................. 10-2012-0151162

(51) Int. Cl.
*H01L 27/32*   (2006.01)
*H01L 51/56*   (2006.01)
*H01L 51/52*   (2006.01)

(52) U.S. Cl.
CPC ............ *H01L 51/56* (2013.01); *H01L 51/5256* (2013.01); *H01L 27/3244* (2013.01)

(58) Field of Classification Search
CPC combination set(s) only.
See application file for complete search history.

(56) References Cited

U.S. PATENT DOCUMENTS

2008/0284737 A1* 11/2008 Kim .................. G06F 3/0238 345/168
2010/0244029 A1* 9/2010 Yamazaki .......... H01L 27/1225 257/52
2013/0169515 A1* 7/2013 Prushinskiy et al. .......... 345/55

* cited by examiner

*Primary Examiner* — Fernando L Toledo
*Assistant Examiner* — Lawrence-Linh T Nguyen
(74) *Attorney, Agent, or Firm* — Fenwick & West LLP

(57) ABSTRACT

An organic light emitting diode device includes an array substrate including a display region where a plurality of pixel regions each include a light emitting diode, and a non-display region surrounding the display region; and a protection layer covering the display region, extending to the non-display region, and including a round corner, wherein a maximum of a radius of the corner of the protection layer is determined according to a distance between a side of the protection layer and a side of the display region corresponding to the side of the protection layer, and the radius of the corner is at least 0.1 mm.

6 Claims, 3 Drawing Sheets

ORGANIC LIGHT EMITTING DIODE DEVICE AND METHOD OF MANUFACTURING THE SAME

CROSS-REFERENCE TO RELATED APPLICATION

The present invention claims priority under 35 U.S.C. §119(a) from Korean Patent Application No. 10-2012-0151162, filed in Korea on Dec. 21, 2012, which is hereby incorporated by reference for all purposes as if fully set forth herein.

BACKGROUND OF THE INVENTION

1. Field of the Invention

The present invention relates to an organic light emitting diode device, and more particularly, to an organic light emitting diode device and a method of manufacturing the same.

2. Discussion of the Related Art

Recently, the field of display devices configured to process and display a large amount of information has rapidly been improved. In particular, organic light emitting diode devices (OLEDs) have lately been developed as flat panel displays (FPDs) having excellent performance, such as a small size, light weight, and low power consumption.

Among various types of OLEDs, an active matrix type OLED including a switching transistor in each of pixel regions arranged in a matrix form is widely used.

The OLED includes an array substrate and an encapsulation substrate protecting the array substrate, and a protection layer is formed on the array substrate to prevent moisture permeation into an array element of the array substrate.

Figure (FIG. 1) is a plan view illustrating a part of an OLED according to the related art.

Referring to FIG. 1, an active region, i.e., a display region AA of the OLED 10 has a rectangular shape in a plan view, and pixel regions P are arranged in a matrix form in the display region AA.

The display region AA is covered by a protection layer 50, and thus moisture permeation is prevented. The protection layer 50 extends to a non-display region NA around the display region AA.

The protection layer 50 has a roughly rectangular shape in a plan view similar to the display region AA, and a corner portion of the protection layer 50 has a round shape due to factors in production.

When a radius of the corner portion of the protection layer 50 is small, the corresponding corner portion of the display region AA is exposed. In this case, moisture is permeated through the corner portion into the display area AA, and this causes defect of elements. Accordingly, lifetime of the OLED is reduced.

To prevent this, increase of the radius of the corner portion of the protection layer 50 is suggested, but this causes increase of an extension width A of the protection layer 50. This causes increase of size of the non-display region NA of the OLED, and thus bezel of the OLED increases.

SUMMARY OF THE INVENTION

Accordingly, the present invention is directed to an OLED and a method of manufacturing the same which substantially obviates one or more of the problems due to limitations and disadvantages of the related art.

An advantage of the present invention is to provide an OLED and a method of manufacturing the same that can prevent defect of elements and also reduce bezel.

Additional features and advantages of the present invention will be set forth in the description which follows, and in part will be apparent from the description, or may be learned by practice of the invention. These and other advantages of the invention will be realized and attained by the structure particularly pointed out in the written description and claims thereof as well as the appended drawings.

To achieve these and other advantages and in accordance with the purpose of the present invention, as embodied and broadly described herein, an organic light emitting diode device includes an array substrate including a display region where a plurality of pixel regions each include a light emitting diode, and a non-display region surrounding the display region; and a protection layer covering the display region, extending to the non-display region, and including a round corner, wherein a maximum of a radius of the corner of the protection layer is determined according to a distance between a side of the protection layer and a side of the display region corresponding to the side of the protection layer, and the radius of the corner is at least 0.1 mm.

In another aspect, a method of manufacturing an organic light emitting diode device includes forming an array substrate including a display region where a plurality of pixel regions each include a light emitting diode, and a non-display region surrounding the display region; and forming a protection layer covering the display region, extending to the non-display region, and including a round corner, wherein a maximum of a radius of the corner of the protection layer is determined according to a distance between a side of the protection layer and a side of the display region corresponding to the side of the protection layer, and the radius of the corner is at least 0.1 mm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, which are illustrated in the accompanying drawings.

Figure 1:
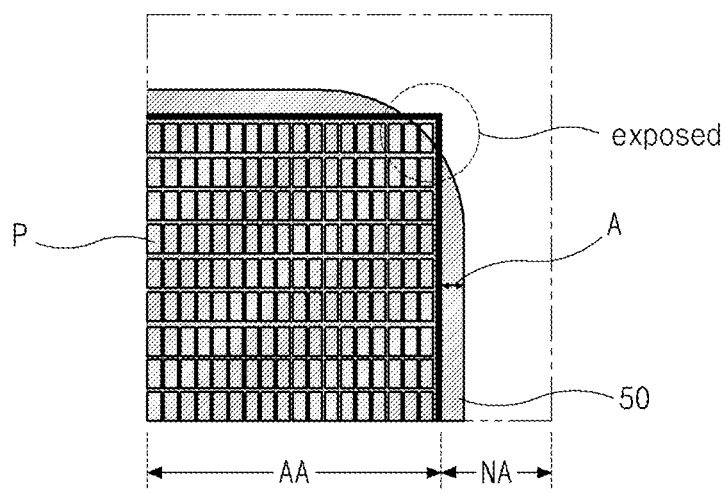
FIG. 1 is a plan view illustrating a part of an OLED according to the related art.
Figure 2:
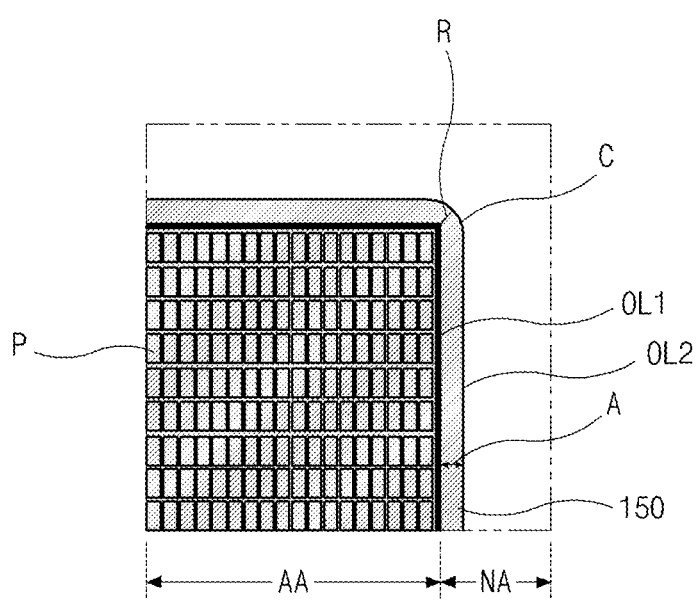
FIGS. 2 and 3 are a plan view and a cross-sectional view, respectively, illustrating a part of an OLED according to an embodiment of the present invention.
Figure 3:
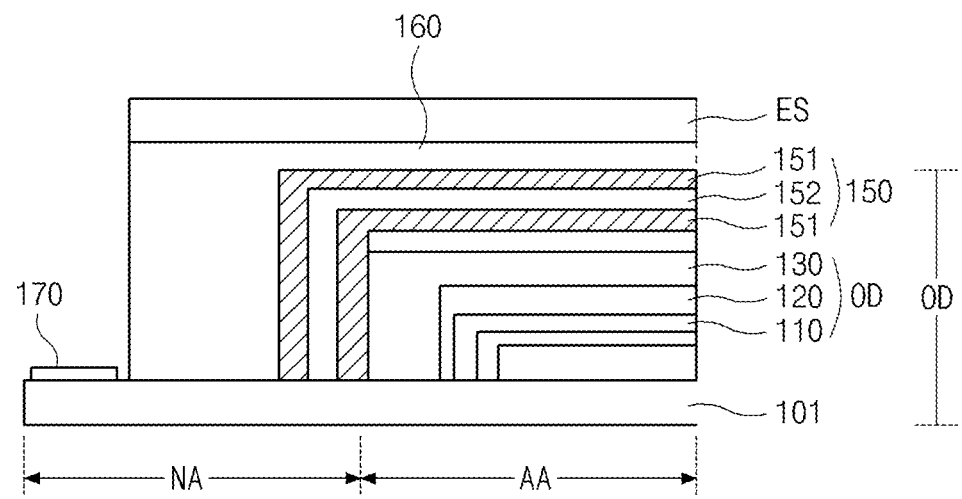
Figure 4:
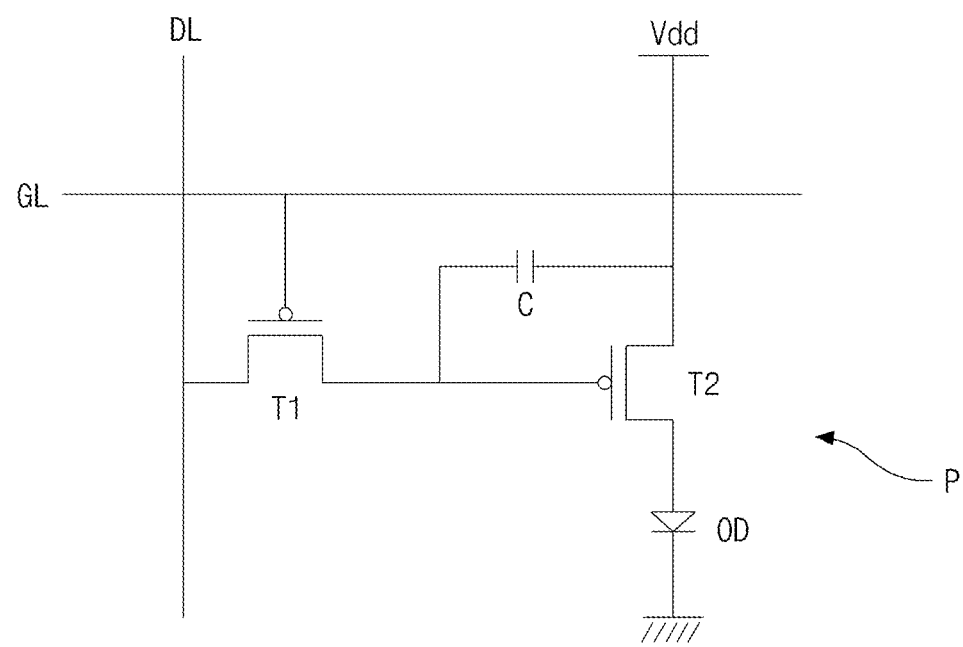
FIG. 4 is a circuit diagram illustrating a pixel of the OLED according to the embodiment of the present invention.

FIGS. 2 and 3 are a plan view and a cross-sectional view, respectively, illustrating a part of an OLED according to an embodiment of the present invention, and FIG. 4 is a circuit diagram illustrating a pixel of the OLED according to the embodiment of the present invention.

Referring to FIGS. 2 and 3, the OLED 100 of the embodiment includes a display region AA and a non-display region NA surrounding the display region AA.

The OLED 100 includes an array substrate AS as a lower substrate and an encapsulation substrate ES facing the array substrate AS.

The encapsulation substrate ES functions to protect the array substrate AS, and may be made of metal, glass, plastic or etc. and may be formed in film type.

The encapsulation substrate ES may be coupled to the array substrate AS using an adhesive 160.

In the display region AA of the array substrate AS, pixel regions P are arranged in a matrix form.

Referring to FIG. 4, the pixel region P is defined by gate and data lines GL and DL crossing each other. In the pixel region P, for example, a switching transistor T1, a driving transistor T2, a capacitor C, and a light emitting diode OD are formed.

The switching transistor T1 is connected to the gate and data lines GL and DL, and the driving transistor T2 is connected to the switching transistor T1. The capacitor C is connected between the driving transistor T2 and a high driving voltage (Vdd) source, and the light emitting diode OD is connected to the driving transistor T2.

The light emitting diode OD may include first and second electrodes 110 and 130, and an organic light emitting layer 120 therebetween, as shown in FIG. 3. In the drawings, for the purpose of explanations, the light emitting diode OD among array elements formed in the display region AA is mostly shown.

One of the first and second electrodes 110 and 130 is an anode, and the other one is a cathode. For the purpose of explanations, in this embodiment, the first electrode 110 is an anode, and the second electrode 130 is a cathode.

The organic light emitting layer 120 is supplied with holes and electrons from the first and second electrodes 110 and 130, respectively, and emits light through combinations of the holes and the electrons.

Even though not shown in the drawings, at least one organic layer may be formed between the organic light emitting layer 120 and the first electrode 110, and between the organic light emitting layer 120 and the second electrode 130. For example, a hole injecting layer and a hole transporting layer may be formed between the first electrode 110 and the organic light emitting layer 120, and an electron injecting layer and an electron transporting layer may be formed between the second electrode 130 and the organic light emitting layer 120.

A protection layer 150 is formed on the light emitting diode OD. The light emitting diode 150 functions to block moisture from the outside and prevent array elements of the display region AA from being damaged.

The protection layer 150 may be composed of at least one layer, and preferably, multiple layers.

When the multiple-layers form the protection layer 150, the multiple layers may be composed of organic layers, inorganic layers, or both organic and inorganic layers. It is preferred that the organic and inorganic layers are used together, which is shown in the embodiment.

Referring to FIG. 3, the protection layer 150 includes an inorganic layer 151 and an organic layer 152, and the inorganic layer 151 and the organic layer 152 may be formed alternately.

The inorganic layer 151 may be formed, for example, in various methods such as a PECVD (plasma enhanced chemical vapor deposition), sputtering, evaporation and ALD (atomic layer deposition).

The organic layer 152 may be formed, for example, in various methods such as a screen printing, ink-jet printing and dispensing.

Further, after the organic layer 152 may be formed in the method as above, a UV (ultraviolet) curing or heat curing may be performed. The organic layer 152 may be made of, for example, but not limited to, a resin containing at least one of epoxy, acryl, urethane and Si.

The inorganic layer 151 may be made of, for example, but not limited to, an inorganic material containing Si or Al.

The protection layer 150 covers the entire display region AA and extends to the non-display region NA.

At a peripheral portion of the non-display region NA of the array substrate AS, a pad 170 connected to a driving circuit and supplied with a driving signal may be formed. It is preferred that the pad 160 is exposed for electrical connection with the driving circuit. Accordingly, the protection layer 150 is configured to expose a region where the pad 170 is formed.

The protection layer 150 has a roughly rectangular shape in a plan view, and a corner portion of the protection layer 150 has a round shape. In other words, the display region AA has an angulated rectangular shape with a corner at 90 degrees angle while the protection layer has a rectangular shape with the corner in a round shape.

Accordingly, the protection layer 150 has a plan outline having four sides OL2 in a straight line shape, and four corners C in a round shape.

Since the protection layer 150 is formed to completely block moisture permeation inside the display region AA, the outline of the protection layer 150 entirely surrounds the display region AA.

A distance between the side OL2 of the protection layer 150 and a side OL1 of the display region AA corresponding to the side OL2, i.e., an extension width of the protection layer 150 is called A, and a radius of the corner C of the protection layer 150 is called R.

In this embodiment, R is designed according to an expression, Rmax=3.25A−0.325 (where Rmax is a maximum of R). It is preferred that R and A each are at least 0.1 mm.

According to this embodiment, R can be determined depending on the extension width A of the protection layer 150 outside the display region AA. In other words, R has a permissible range from 0.1 mm as a minimum to Rmax as a maximum (i.e., 0.1≤R≤Rmax).

The protection layer 150 can be designed such that the corner C of the protection layer 150 is defined according to A, and permissible range of the corner C has a limit.

Figure 5:
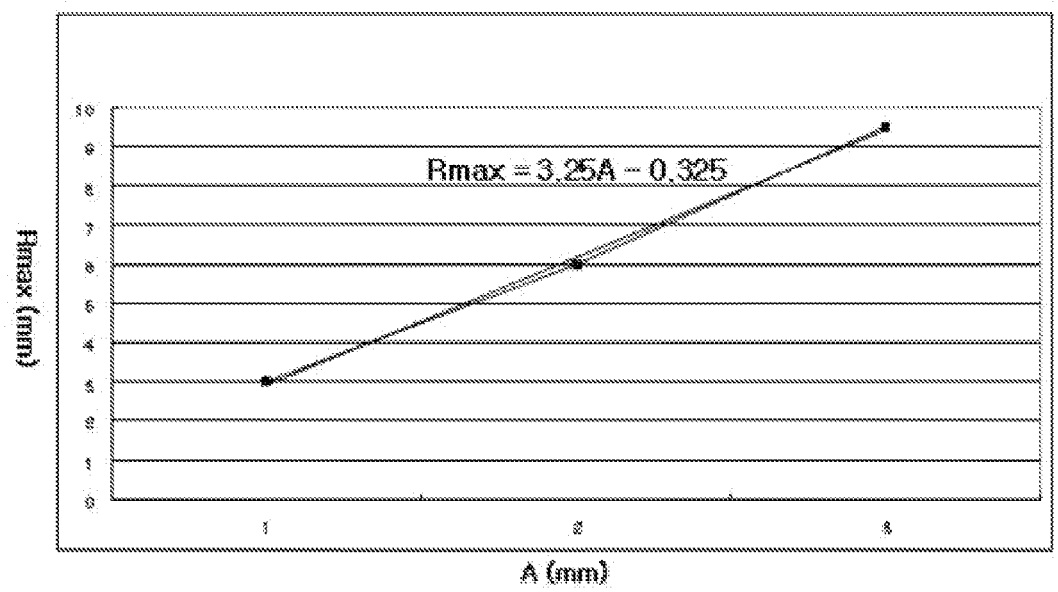
FIG. 5 is a graph illustrating relation of A and Rmax according to the embodiment of the present invention.

The expression as above is referred to FIG. 5, which is a graph illustrating relation of A and Rmax according to the embodiment of the present invention.

As described above, the radius R of the corner C of the protection layer 150 can be set according to the extension width A of the protection layer 150. In other words, relationship of the side OL2 and the corner C of the protection layer 150 having the round corner C can be made.

Accordingly, when a narrow bezel is realized, it is possible to reliably design the OLED 100 such that moisture permeation can be prevented through the corner C.

Therefore, cost of mask design for OLED is reduced, and simulation to reduce cost of mask design for OLED and to secure reliability is possible, and thus time and cost for design can be reduced, and expectation of reliability in production of OLED is possible.

A method of manufacturing the OLED of the embodiment is explained as below with reference to FIGS. 2 to 4.

Array elements are formed in the display region AA of the array substrate AS. For example, the gate and data lines GL and DL crossing each other, the switching transistor T1, the driving transistor T2, and the light emitting diode OD are formed on the substrate 101.

When forming the light emitting diode OD, the first electrode 110 is patterned in each pixel region P, and the organic light emitting layer 120 is patterned on the first electrode 110 in each pixel region P. Then, the second electrode 130 is formed entirely in the display region AA on the organic light emitting layer 120.

The protection layer 150 is formed on the array substrate AS having the light emitting diode OD. For example, the inorganic layer 151 and the organic layer 152 are formed alternately to form the protection layer 150.

The protection layer 150 is formed to have the plan outline, as descried above. That is, according to the expression, Rmax=3.25A−0.325, a manufacturer determines the extension width A considering a size of a bezel, and Rmax is calculated based on the extension width A. Accordingly, the radius R of the corner C is determined within a range not beyond the Rmax, i.e., the maximum. When A and R are determined, the protection layer 150 of the outline having A and R is formed.

Through the above processes, the array substrate AS is manufactured.

Then, the array substrate AS is coupled to the encapsulation substrate ES. For example, the adhesive 160 is coated on the array substrate AS, and the array substrate AS having the adhesive 160 is attached to the encapsulation substrate ES.

Alternatively, the adhesive 160 is coated on the encapsulation substrate ES, and the encapsulation substrate ES having the adhesive 160 is attached to the array substrate AS.

By coupling the array substrate AS to the encapsulation substrate ES using the adhesive 160, the OLED 100 is manufactured.

A process of coupling a driving circuit to the OLED 100 may be further performed. For example, by connecting the driving circuit in IC type to the pad 170, the coupling process may be performed.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode device comprising:
   an array substrate including a display region where a plurality of pixel regions each include a light emitting diode, and a non-display region surrounding the display region; and
   a protection layer covering the display region, extending to the non-display region, and having an outline in the non-display region in a plan view, the outline including a round corner that corresponds to a corner of the display region and a side in a straight-line shape that corresponds to a side of the display region,
   wherein a maximum of a radius of the corner of the protection layer is determined according to a distance between the side of the protection layer and the side of the display region corresponding to the side of the protection layer, and the radius of the corner is at least 0.1 mm, and
   wherein a relationship of the radius and the distance is made according to an equation, Rmax=3.25A−0.325, where the Rmax is the maximum of the radius, and the A is the distance between the side of the protection layer and the side of the display region corresponding to the side of the protection layer.

2. The device according to claim 1, wherein the protection layer is comprised of at least one layer using at least one of an organic layer and an inorganic layer.

3. The device according to claim 2, wherein the organic layer is made of resin containing at least one of epoxy, acryl, urethane and Si, and is formed in a screen printing, ink-jet printing, or dispensing method.

4. The device according to claim 2, wherein the inorganic layer includes at least one of Si and Al, and is formed in a PECVD, ALD, sputtering or evaporation method.

5. The device according to claim 1, further comprising an encapsulation substrate coupled to the array substrate having the protection layer using an adhesive.

6. The device according to claim 1, wherein the light emitting diode includes:
   a first electrode;
   a light emitting layer on the first electrode; and
   a second electrode on the light emitting layer and below the protection layer.

* * * * *